(12) United States Patent
Robin et al.

(10) Patent No.: US 10,396,239 B2
(45) Date of Patent: Aug. 27, 2019

(54) OPTOELECTRONIC LIGHT-EMITTING DEVICE

(71) Applicant: Commissariat A L'Energie Atomique et aux Energies Alternatives, Paris (FR)

(72) Inventors: Ivan-Christophe Robin, Grenoble (FR); Hubert Bono, Grenoble (FR); Yohan Desieres, Lans en Vercors (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/389,837

(22) Filed: Dec. 23, 2016

(65) Prior Publication Data

US 2017/0186908 A1 Jun. 29, 2017

(30) Foreign Application Priority Data

Dec. 23, 2015 (FR) ...................................... 15 63251

(51) Int. Cl.
*H01L 31/0352* (2006.01)
*H01L 31/12* (2006.01)
(Continued)

(52) U.S. Cl.
CPC ............ *H01L 33/04* (2013.01); *H01L 25/167* (2013.01); *H01L 27/156* (2013.01);
(Continued)

(58) Field of Classification Search
CPC ..... H01L 31/035281; H01L 31/035236; H01L 31/02322; H01L 31/035209; H01L 31/107;
(Continued)

(56) References Cited

U.S. PATENT DOCUMENTS

| 4,284,884 A | 8/1981 | Dyment et al. |
| 6,617,795 B2 | 9/2003 | Bruning |

(Continued)

FOREIGN PATENT DOCUMENTS

| WO | WO 2007/065876 A2 | 6/2007 | |
| WO | WO 2007/088267 A2 | 8/2007 | |
| WO | WO 2013189949 A1 * | 12/2013 | ........... H01L 27/153 |

OTHER PUBLICATIONS

French Preliminary Search Report dated Aug. 1, 2016 in French Application 15 63251, filed on Dec. 23, 2015 ( with English Translation of Categories of Cited Documents and Written Opinion).

*Primary Examiner* — Natalia A Gondarenko
(74) *Attorney, Agent, or Firm* — Oblon, McClelland, Maier & Neustadt, L.L.P.

(57) ABSTRACT

The invention relates to an optoelectronic light-emitting device (1), including:
  at least one light-emitting diode (40) having an emitting surface (44) adapted to emit so-called excitation luminous radiation; and
  a photoluminescent material (31) that coats the emitting surface (44), the photoluminescent material containing photoluminescent particles adapted to convert said excitation luminous radiation through the emitting surface (44) at least in part into so-called photoluminescence luminous radiation.

The optoelectronic device includes at least one photodiode (50) adjacent the light-emitting diode (40) having a receiving surface (54) coated by the photoluminescent material (31) and adapted to detect at least part of the excitation radiation and/or the photoluminescence radiation coming from the photoluminescent material (31) through the receiving surface.

10 Claims, 5 Drawing Sheets

(51) Int. Cl.
*H01L 33/00* (2010.01)
*H01L 33/04* (2010.01)
*H01L 33/20* (2010.01)
*H01L 33/36* (2010.01)
*H01L 33/38* (2010.01)
*H01L 25/16* (2006.01)
*H01L 27/15* (2006.01)
*H01L 31/173* (2006.01)
*H01L 31/0232* (2014.01)
*H01L 33/50* (2010.01)
*H01L 33/60* (2010.01)

(52) U.S. Cl.
CPC .............. *H01L 31/02322* (2013.01); *H01L 31/035209* (2013.01); *H01L 31/035236* (2013.01); *H01L 31/125* (2013.01); *H01L 31/173* (2013.01); *H01L 33/0025* (2013.01); *H01L 33/0075* (2013.01); *H01L 33/0095* (2013.01); *H01L 33/507* (2013.01); *H01L 33/60* (2013.01)

(58) Field of Classification Search
CPC .............. H01L 31/125; H01L 31/173; H01L 27/14643–14663; H01L 27/156; H01L 25/167; H01L 33/0025; H01L 33/04; H01L 33/0095; H01L 33/0075; H01L 33/507; H01L 33/60; H01L 31/101; H01L 31/00; H01L 31/0232; H01L 31/02024; H01L 31/0224; H01L 31/022408; H01L 31/14; H01L 31/141; H01L 33/08; H01L 33/18; H01L 33/20; H01L 33/36; H01L 33/38; H01L 33/382; H01L 33/385; H01L 33/387; H01L 33/647; H01L 27/144–1461; H01L 27/14636; H01L 27/14638; H01L 27/14649; H01L 27/32; H01L 27/14627; H01L 27/14652; H01L 27/14669; H01L 27/14694; H01L 27/153; H01L 25/042; H01L 25/0652; H01L 25/0655; H01L 25/072; H01L 25/0753; H01L 25/112; H01L 25/115; H01L 24/28; H01L 24/30; H01L 23/48; H01L 23/481; H01L 23/482; H01L 23/49827; H01L 23/52; H01L 23/5226; H01L 23/5286; H01L 23/535; H01L 23/538; H01L 23/5384; H01L 31/143; H01L 31/153; H01L 31/16
USPC ........ 257/13, 98, 99, 89, 79, 88, 93; 438/28, 438/29, 34, 42
See application file for complete search history.

(56) References Cited

U.S. PATENT DOCUMENTS

| | | | |
|---|---|---|---|
| 7,213,942 B2* | 5/2007 | Jiang | H05B 33/0809 257/88 |
| 7,619,238 B2* | 11/2009 | Gaska | H01L 33/06 257/14 |
| 2003/0030808 A1 | 2/2003 | Marshall et al. | |
| 2003/0076056 A1 | 4/2003 | Schuurmans et al. | |
| 2009/0040755 A1 | 2/2009 | Kopp et al. | |
| 2009/0212316 A1* | 8/2009 | Braune | H01L 24/97 257/99 |
| 2010/0001300 A1 | 1/2010 | Raring et al. | |
| 2010/0006873 A1 | 1/2010 | Raring et al. | |
| 2010/0264835 A1 | 10/2010 | Bilenko et al. | |
| 2012/0062113 A1 | 3/2012 | Tang et al. | |
| 2012/0194103 A1* | 8/2012 | Odnoblyudov | H01L 33/382 315/363 |
| 2013/0207156 A1 | 8/2013 | Moosburger et al. | |
| 2013/0248736 A1* | 9/2013 | Tkachuk | G01N 21/77 250/458.1 |
| 2013/0285102 A1 | 10/2013 | Tang et al. | |
| 2014/0184062 A1 | 7/2014 | Kolodin | |
| 2015/0155331 A1* | 6/2015 | Guenard | H01L 27/153 257/93 |

* cited by examiner

OPTOELECTRONIC LIGHT-EMITTING DEVICE

TECHNICAL FIELD

The invention relates to an optoelectronic light-emitting device including at least one light-emitting diode covered with a material containing photoluminescent particles. The invention finds one particular application in lighting systems where it is required to control or to adjust the emission spectrum associated with the light-emitting diodes.

PRIOR ART

There exist optoelectronic devices including light-emitting diodes the emitting surface of which is covered by a photoluminescent material. This is notably the case of lighting systems emitting white light.

Light-emitting diodes are formed of a stack of semiconductor layers adapted to emit luminous radiation, for example blue or ultraviolet luminous radiation. The semiconductor layers are generally based on a material containing elements from column III and column V of the periodic table, such as a III-N compound, notably gallium nitride (GaN), indium and gallium nitride (InGaN) or aluminium and gallium nitride (AlGaN).

A layer of photoluminescent material depending on the required characteristics of the emission spectrum of the optoelectronic device covers the emitting surface of the light-emitting diode, the photoluminescent material being adapted to convert at least some of the so-called excitation luminous radiation emitted by the light-emitting diode into so-called photoluminescence luminous radiation of longer wavelength. The photoluminescent material may contain particles dispersed in a binder matrix, for example particles of cerium-doped yttrium-aluminium garnet, known as YAG:Ce.

However, there exists a requirement to control the characteristics of the emission spectrum of the optoelectronic device and notably that associated with the light-emitting diode itself. There also exists a requirement for an optoelectronic device having a monolithic structure that allows a high density of light-emitting diodes.

SUMMARY OF THE INVENTION

An objective of the invention is to remedy at least in part the disadvantages of the prior art, and more particularly to propose an optoelectronic light-emitting device, including:
  at least one light-emitting diode having an emitting surface adapted to emit so-called excitation luminous radiation; and
  a photoluminescent material that coats the emitting surface, the photoluminescent material containing photoluminescent particles adapted to convert said excitation luminous radiation through the emitting surface at least in part into so-called photoluminescence luminous radiation.

According to the invention, the optoelectronic device includes at least one photodiode adjacent the light-emitting diode having a receiving surface coated by the photoluminescent material and adapted to detect at least part of the excitation radiation and/or the photoluminescence radiation coming from the photoluminescent material through the receiving surface.

Some preferred but nonlimiting aspects of this source are as follows:

The light-emitting diode and the photodiode may each have a mesa structure, the emitting surface and the receiving surface being substantially coplanar.

The light-emitting diode and the photodiode may each include a first semiconductor portion doped with a first conductivity type and a second semiconductor portion doped with a second conductivity type opposite the first conductivity type, the first and second semiconductor portions being respectively substantially coplanar and made from a material with the same composition.

The first doped semiconductor portion of the light-emitting diode and that of the photodiode each have a lateral flank including a stepped surface formed by a second part of the first doped semiconductor portion facing a first part thereof.

A lateral electrical connection element may extend between the light-emitting diode and the adjacent photodiode so as to be in electrical contact with the stepped surface of the first doped semiconductor portion, the lateral connection element being further electrically insulated from the second doped semiconductor portion and active zones situated between the first and second doped semiconductor portions by dielectric portions covering lateral flanks of the mesa structures.

The light-emitting diode and the photodiode may each include an active zone situated between the first and second doped semiconductor portions, the active zones being substantially coplanar and made from a material with the same composition.

The active zones of the light-emitting diode and the photodiode may each include at least one first quantum well, said first quantum well of the active zone of the light-emitting diode being adapted to emit the excitation luminous radiation at a so-called excitation wavelength.

The active zones of the light-emitting diode and the photodiode may each include at least one second quantum well, said quantum well of the active zone of the photodiode being adapted to detect the photoluminescence luminous radiation.

The second quantum well may be situated between an N-type first doped semiconductor portion and the first quantum well.

An optical filter may be disposed between the photoluminescent material and the receiving surface of the photodiode, the filter being adapted to transmit the photoluminescence radiation and to block transmission of the excitation radiation.

The optoelectronic device may further include a control device adapted to modify the excitation luminous radiation emitted by the light-emitting diode on the basis of a signal resulting from detection of the luminous radiation by the photodiode.

The optoelectronic device may include electrical contacts adapted to bias the light-emitting diode and the photodiode, the electrical contacts being situated at the level of a face of the light-emitting diode and the photodiode opposite the emitting surface and the receiving surface. The opposite face may be the rear face of an optoelectronic chip that includes the light-emitting diode and the photodiode. The electrical contacts may be electrical connection elements disposed in contact with conductive portions that are in contact with the second doped portions of the diodes and electrical connection elements disposed in contact with lateral connection elements that are in contact with the first doped portions of the diodes.

The invention also relates to a method of manufacturing an optoelectronic light-emitting device having any one of the preceding features, in which:
i) producing at least one light-emitting diode having an emitting surface and able to emit so-called excitation luminous radiation, and at least one adjacent photodiode having a receiving surface;
ii) covering the emitting surface and the receiving surface with a photoluminescent material containing photoluminescent particles adapted to convert said excitation luminous radiation through the emitting surface at least in part into so-called photoluminescence luminous radiation.

The step i) may include the substeps in which:
a. producing a stack of layers including a first doped semiconductor layer and a second doped semiconductor layer between which is disposed an active layer including at least one quantum well;
b. etching the stack of layers so as to form a mesa structure intended to form a light-emitting diode and a mesa structure intended to form an adjacent photodiode, each mesa structure being formed of a stack of a first doped semiconductor portion, an active zone and a second doped semiconductor portion, the first doped semiconductor portion of said mesa structures including a lateral flank having a stepped surface;
c. producing dielectric portions covering the lateral flanks of the mesa structures with the exception of the stepped surfaces;
d. depositing an electrically conductive material between the mesa structures, the conductive material being in contact with the stepped surface of the first doped semiconductor portion and electrically insulated by the dielectric portions from the zone and the second doped semiconductor portion.

There may be produced electrical connection elements adapted to forward bias the light-emitting diode and to reverse bias the photodiode from electrically conductive biasing portions situated on a face opposite the photoluminescent material.

BRIEF DESCRIPTION OF THE DRAWINGS

Other aspects, objects, advantages and features of the invention will become more apparent in the light of the following detailed description of preferred embodiments thereof given by way of nonlimiting example and with reference to the appended drawings, in which.

DETAILED DESCRIPTION OF PARTICULAR EMBODIMENTS

In the figures and in the remainder of the description the same references represent identical or similar elements. Moreover, for the sake of the clarity of the figures, the various elements are not represented to scale. Also, the terms "substantially", "approximately", "about" are to be understood as meaning "to within 10%".

The invention relates to an optoelectronic device including at least one light-emitting diode and a photodiode adjacent the latter, the emitting surface of the light-emitting diode and the receiving surface of the photodiode being coated with a photoluminescent material containing photoluminescent particles. The photodiode is adjacent the light-emitting diode in that it is situated on the same side of the photoluminescent material as it and in its vicinity.

The emitting surface is a surface of the light-emitting diode through which so-called excitation luminous radiation is emitted. The receiving surface is a surface of the photodiode through which incident luminous radiation is received and detected by the photodiode.

The photoluminescent material is a material adapted to convert incident luminous radiation emitted by the light-emitting diode at least partly into so-called luminescence luminous radiation at a different wavelength. The particles are separate elements of a photoluminescent material which may be any shape, for example spherical, angular, flattened, elongated or any other shape. Here the size of the particles is the smallest dimension of the particles and the mean size is the arithmetic mean of the sizes of the particles.

Figure 1A:
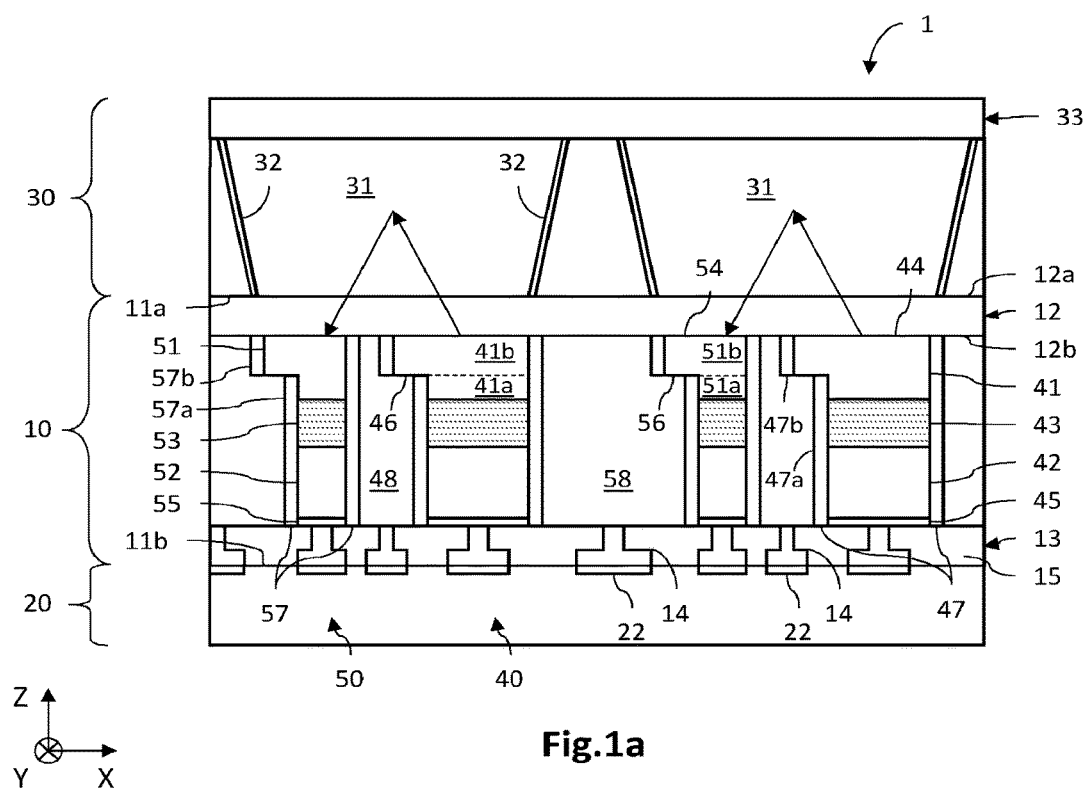
FIG. 1a is a diagrammatic sectional view of an optoelectronic light-emitting device according to one embodiment in which the cap includes photoluminescent blocks and FIG. 1b is a variant in which the cap includes a photoluminescent layer.

FIG. 1a is a diagrammatic sectional view of an optoelectronic light-emitting device according to one embodiment.

There is defined here and for the remainder of the description a three-dimensional orthonomic frame of reference (X,Y,Z) in which the plane (X,Y) is substantially parallel to the plane of the emitting and receiving surfaces and the axis Z is oriented in a direction orthogonal to the emitting and receiving surfaces.

Here the optoelectronic device 1 includes:
a. A first printed circuit chip 10, termed an optoelectronic chip, including at least one light-emitting diode 40 and one photodiode 50 disposed adjacent the latter. Here the optoelectronic chip 10 includes a matrix of light-emitting diodes 40 defining a matrix of luminous pixels in which at least some of the pixels include a photodiode 50.
b. A second printed circuit chip 20, termed a control chip, disposed on a so-called rear face 11b of the electronic chip 10. The control chip 20 includes connection elements for biasing the light-emitting diodes 40 and the photodiodes 50.
c. A cap 30 disposed on a so-called front face 11a of the optoelectronic chip 10 opposite the rear face 11b and including the material containing photoluminescent particles.

The optoelectronic chip 10 includes a plurality of light-emitting diodes 40 and photodiodes 50 each formed of a stack of first and second doped semiconductor portions between which is situated an active zone. The active zone is the region of a diode in which luminous radiation is emitted (in the case of a light-emitting diode) or detected (in the case of a photodiode).

The light-emitting diodes 40 and the photodiodes 50 form substantially coplanar mesa structures. By a mesa structure is meant a structure formed of a stack of substantially plane semiconductor layers or portions the active zone of which projects above a growth substrate after an etching step. The structure of the light-emitting diodes and the photodiodes may be identical or similar to the structure described in the paper by Fan et al. entitled *III-nitride micro-emitter arrays development and applications*, J. Phys. D: Appl. Phys. 41 (2008) 094001. Alternatively, and preferably, it may be identical or similar to the structure described in patent application FR1456085 filed 27 Jun. 2014 the text of which is considered to form an integral part of the present description. The mesa structures are substantially coplanar in the sense that the semiconductor portions of the light-emitting diodes and those of the photodiodes are mutually coplanar.

The light-emitting diode 40 includes a stack formed of a first doped semiconductor portion 41 of a first conductivity type, for example of type N, and a second doped semiconductor portion 42 of a second conductivity type opposite the first type, for example type P, between which is a so-called emissive active zone 43 at which the luminous radiation from the diode is generated. A face of the N-doped first portion 41 opposite the active zone 43 forms an emitting surface 44 through which the emitted luminous radiation is emitted.

The photodiode 50 includes a stack formed of a first doped semiconductor portion 51 of a first conductivity type, for example of type N, and a second doped semiconductor portion 52 of a second conductivity type opposite the first type, for example of type P, between which is a so-called detection active zone 53 where received incident luminous radiation is detected. A face of the N-doped first portion 51 opposite the active zone 53 forms a receiving surface 54 through which incident luminous radiation is received.

In this example, each semiconductor portion 41, 42, 43 of the light-emitting diodes 40 is respectively coplanar with that 51, 52, 53 of the photodiodes 50 and they have substantially identical thicknesses and compositions. To be more precise, the N-doped first portions 41 of the light-emitting diodes 40 are coplanar with those 51 of the photodiodes 50 and have substantially identical thicknesses and compositions. By materials of the same composition is to be understood materials formed of elements from the periodic table according to an identical proportion. Likewise the P-doped portions 42, 52 and the active zones 43, 53. The thicknesses of the light-emitting diodes and the photodiodes are therefore substantially identical. Also, the emitting surface 44 and the receiving surface 54 are substantially coplanar. Each light-emitting diode 40 and each photodiode 50 further include an electrically conductive portion 45, 55 in contact with a face of the second doped portion 42, 52 (here of type P) opposite the active zone 43, 53. The thickness of the conductive portion 45, 55 may be between 3 nm and 500 nm inclusive. The conductive portions 45, 55 are preferably substantially coplanar.

Each light-emitting diode 40 and each photodiode 50 have the N-doped first portion 41, 51 structured to form a step at the level of a lateral flank reflected in an increase of the lateral dimensions in the plane (X,Y). To be more precise, each N-doped first portion 41, 51 includes a first part 41a, 51a situated between the active zone 43, 53 and a second part 41b, 51b the lateral dimensions of which are substantially identical to those of the active zone 43, 53. It also includes a second part 41b, 51b the face of which opposite the first part 41a, 51a forms the emitting surface 44 or the receiving surface 54, the lateral dimensions of which are greater than those of the first part 41a, 51b at the level of a lateral flank. The N-doped first portion 41, 51 of the diodes 40, 50 therefore has a stepped surface 46, 56 that extends substantially orthogonally to the axis Z and connects the lateral flanks of the first parts 41a, 51a and the second parts 41b, 51b. Also, the active zone 43, 53 and the P-doped second portion 42, 52 of the diodes 40, 50 include lateral flanks that extend with no discontinuity along the axis Z. The lateral dimensions of the second part 41b, 51b of the N-doped first portion 41, 51 is at least 1% greater than that of the first part 41a, 51a. For example, for a width of the first part 41a, 51a of the N-doped portion of 80 μm the width of the second part 41b, 51b may be 85 μm.

The light-emitting diodes 40 and the photodiodes 50 may have a thickness between 100 nm and 50 μm inclusive, the thickness of the N-doped first portion 41, 51 may be between 50 nm and 20 μm inclusive, that of the active zone 43, 53 may be between 10 nm and 500 nm inclusive, and that of the P-doped second portion 42, 52 may be between 50 nm and 20 μm inclusive. The lateral dimensions of the diodes as measured at the level of the emitting and receiving surfaces may be between 500 nm and a few millimeters inclusive, depending on the target applications. The lateral dimensions of the light-emitting diodes are preferably greater than those of the photodiodes.

The light-emitting diodes and the photodiodes may be based on a III-V semiconductor material, i.e. one primarily comprising at least one element from column III and one element from column V of the periodic table. The diodes may notably be based on a III-N compound, such as GaN, InGaN, AlGaN, AlN, InN, AlInGaN, for example. The active zones may include at least one quantum well based on a semiconductor material having a forbidden band energy lower than that of the doped portions. For example, the doped portions are made of GaN and the active zone includes alternating intrinsic (not intentionally doped) semiconductor layers of GaN and at least one quantum well based on InGaN. The light-emitting diode may be adapted to emit blue light, i.e. light with an emission spectrum having an intensity peak between approximately 440 nm and 490 nm inclusive and here the photodiode is adapted to detect the blue light emitted by the diode and received through the receiving surface.

The lateral flanks of the diodes are covered with a dielectric portion 47, 57 with the exception of the stepped surfaces 46, 56. To be more specific, the lateral flanks including no step are covered continuously with a dielectric portion 47, 57. The lateral flanks including a step are coated with a dielectric portion in two parts: a first part 47a, 57a that covers the lateral flanks of the P-doped portion 42, 52 of the active zone 43, 53 and of the first part 41a, 51a of the N-doped portion 41, 51 and a second part 47b, 57b separate from the first part that covers the lateral flanks of the second part 41b, 51b of the N-doped portion 41, 51. The stepped surfaces 46, 56 are therefore not coated with any dielectric portion 47, 57. The dielectric portion 47, 57 also covers the lateral flanks of the conductive portion 45, 55.

The optoelectronic chip further includes so-called lateral electrical connection elements 48, 58 inserted between the light-emitting diodes 40 and the adjacent photodiodes 50 that extend between the front face 11a and the rear face 11b of the optoelectronic chip. Thus each light-emitting diode 40 includes a lateral connection element 48 that extends between the dielectric portion 47a, 47b situated at the level of the step 46 and the dielectric portion 57 of the facing photodiode 50. The lateral connection element 48 is therefore electrically insulated from the active zone 43 and the P-doped portion 42 of the light-emitting diode 40 and from the facing photodiode 50. It is, however, in electrical contact with the N-doped portion 41 of the light-emitting diode 40 at the level of the stepped surface 46 so as to be able to apply a given electrical potential to the N-doped portion 41. In a similar manner, each photodiode 50 includes a so-called lateral connection element 58 that extends between the dielectric portion 57a, 57b situated at the level of the step 56 and the dielectric portion 47 of the facing light-emitting diode 40. The lateral connection element 58 is therefore electrically insulated from the active zone 53 and from the P-doped portion 52 of the photodiode and from the facing light-emitting diode 40. It is, however, in electrical contact with the N-doped portion 51 of the photodiode at the level of the stepped surface 56 so as to be able to apply a given electrical potential to this N-doped portion 51 (of opposite sign of that of the lateral connection element of the light-emitting diode). Note that the lateral connection elements 48, 58 are electrically insulated from the conductive portions 45, 55 by the dielectric portions 47, 57. The thickness and the material of the dielectric portions 47, 57 are chosen to produce an acceptable leakage current between the conductive portion and the lateral connection elements. The thickness may be of the order of a few nanometers, for example between 3 nm and 5 nm inclusive depending on the dielectric material used.

In this example, the optoelectronic device includes an (optional) dielectric layer 12 inserted between the light-emitting diodes and photodiodes and the photoluminescent material cap 30. It is made of dielectric material, for example $Si_3N_4$, so as to prevent short-circuits between the diodes and the corresponding lateral connection elements and can enhance the extraction of light. The thickness of the dielectric layer 12 is between 500 nm and 50 μm inclusive, for example, preferably between 1 μm and 5 μm inclusive. It has a front face 12a and an opposite rear face 12b. The light-emitting diodes 40 and the photodiodes 50 are in contact with the rear face 12b of the dielectric layer at the level of the respective emitting and receiving surfaces. To enhance the extraction of the luminous radiation emitted by the light-emitting diodes the front face 12a may feature raised patterns (not shown) facing the emitting surfaces and possibly facing the receiving surfaces.

In this example, the optoelectronic device further includes an (optional) electrical connection layer 13 inserted between the diodes 40, 50 and the control chip 20, facilitating the electrical connection between the optoelectronic chip and the control chip. The connection layer 13 therefore includes electrical connection elements 14 providing the connection between the lateral connection elements 48, 58 with conductive portions 22 of the control chip and connection elements 14 providing the connection between the conductive portions 45, 55 with other conductive portions 22 of the control chip. The connection elements 14 are electrically insulated from one another by a dielectric material 15. The connection layer 13 has a substantially constant thickness and a face opposite the diodes forms the rear face 11b of the optoelectronic chip.

The optoelectronic light-emitting device further includes a control chip 20 assembled to the optoelectronic chip at the level of the rear face 11b. The control chip notably provides the electrical connection of the diodes 40, 50 so as to provide for the emission of light by the light-emitting diodes and detection by the photodiodes. The conductive portions 22 therefore provide forward biasing of the light-emitting diodes 40 and reverse biasing of the photodiodes 50. To be more precise, a first negative electrical potential is applied to the N-doped portions 41 of the light-emitting diodes via the lateral connection elements 48 and a first positive potential is applied to the P-doped portions 42 via the conductive portions 45. Moreover, a second negative potential is applied to the P-doped portions 52 of the photodiodes via the conductive portions 55 and a second positive potential is applied to the N-doped portions 51 via the lateral connection elements 58. It is therefore possible to apply different potential differences to the light-emitting diodes and the photodiodes. The control chip can also include transistor-type electronic components for controlling emission from the light-emitting diodes and reading the detection electrical signals from the photodiodes. Alternatively, it may be a passive component essentially including only lines for electrically connecting the conductive portions to remotely located electronic components.

The light-emitting device may further include a feedback control device adapted to correlate the control electrical signal of the light-emitting diodes as a function of the detection electrical signal from the adjacent photodiodes. It is then possible to increase or to decrease the intensity of the emission from the light-emitting diodes as a function of the intensity of the luminous radiation detected by each adjacent photodiode. This feedback control device may be situated in the control chip or remotely located.

The light-emitting device may further include a device for analyzing the detection electrical signal from the photodiode. It is then possible to compare the intensity of the detected luminous radiation to a threshold value and to modify the electrical signal controlling the light-emitting diode as a function of any difference relative to the threshold value or even to send information to a user.

The optoelectronic device also includes a cap 30 including the photoluminescent material 31 containing photoluminescent particles. The photoluminescent material 31 coats the emitting surface 44 of the light-emitting diode and the receiving surface 54 of the photodiode. By coating is to be understood covering a surface partly or completely. Here the photoluminescent material coats the emitting and receiving surfaces completely.

The photoluminescent material contains photoluminescent particles adapted to absorb at least some of the excitation luminous radiation emitted by the light-emitting diode and in response to emit luminescence luminous radiation at a luminescence wavelength greater than the excitation wavelength. The photoluminescent material is generally termed a luminophore (phosphor). The photoluminescent material may take the form of a layer or pad or block. By layer is meant a material the thickness of which is less than its lateral dimensions of length and width in the plane (X,Y), for example less than 10 times, 20 times or even more. By pad or block is meant a material the lateral dimensions of length and width of which are less than those of a layer and the thickness of which may be of the order of magnitude of the lateral dimensions.

By way of illustration only, the photoluminescent material may be adapted to emit in the green range, i.e. the photoluminescent emission spectrum may have a peak intensity between 495 nm and 560 nm inclusive and be based for example on particles of SrSi2O2N2:Eu. It may be adapted to emit in the yellow range, i.e. the photoluminescent emission spectrum may have an intensity peak between 560 nm and 580 nm inclusive and be based for example on particles of YAG:Ce. Of course, other materials are possible, likewise emission in the orange or red range. The size of the photoluminescent particles may be micrometric and between 1 μm and 50 μm inclusive and the average size may be of the order of 10 μm.

Alternatively, the photoluminescent material may contain monocrystalline photoluminescent particles of nanometric size, also termed semiconductor nanocrystals. Semiconductor nanocrystals can be made of cadmium selenide (CdSe), indium phosphide (InP), zinc sulfide (ZnS), zinc selenide (ZnSe), cadmium telluride (CdTe), zinc telluride (ZnTe), cadmium oxide (CdO), zinc and cadmium oxide (ZnCdO), zinc and cadmium sulfide (CdZns), zinc and cadmium selenide (CdZnSe), silver and indium sulfide (AgInS2) and a mixture of at least two of these compounds or any equivalent material. The photoluminescent particles then have an average size between 0.2 nm and 1000 nm inclusive, for example between 1 nm and 100 nm inclusive, and notably between 2 nm and 30 nm inclusive. The size and/or the composition of the photoluminescent particles are chosen as a function of the required luminescence wavelength. Thus CdSe photoluminescent particles with an average size of approximately 3.6 nm are adapted to convert blue light into red light and CdSe particles with an average size of approximately 1.3 nm are adapted to convert blue light into green light.

The photoluminescent particles are preferably dispersed in a binder matrix in the form of a transparent and optically inert material providing a binder function in relation to the photoluminescent particles. By transparent material is to be understood a material that transmits at least 50% of the incident light and preferably at least 80%. By optically inert is to be understood a material that does not emit light in response to absorption of incident light. The matrix may be of silica or an at least partially transparent plastic material, notably silicone or polylactic acid (PLA).

The photoluminescent material has a thickness that notably depends on the type of photoluminescent particles. In the case of particles of micrometric size such as YAG:Ce the thickness may be between 100 μm and 500 μm inclusive and for example of the order of 200 μm. In the case of particles of nanometric size such as CdSe nanocrystals it may be less than 50 nm, or even less than 30 nm, and for example of the order of 1 nm to 5 nm.

In FIG. 1a, the cap 30 includes a plurality of photoluminescent blocks 31 each of which covers a light-emitting diode 40 and the adjacent photodiode 50. Each photoluminescent block 31 is contained in a space provided in the cap delimited by lateral walls that are advantageously inclined and covered with a coating 32 reflecting emission and photoluminescence luminous radiation, for example a film of aluminium. The thickness of the cap notably depends on that of the photoluminescent material. It may be made of an insulative, semiconductor or conductive material, notably depending on whether the luminous extraction dielectric layer is present or not. It is made of silicon, for example. The lateral dimensions of the luminescent blocks are adjusted to suit the lateral dimensions in the plane (X,Y) of a pair comprising a light-emitting diode and the adjacent photodiode. It may therefore be between 2 μm and 1 mm inclusive, depending on the applications. For example, it may be of the order of 100 μm in the case of a "lighting" application of the light-emitting device and of the order of 5 μm to 20 μm in the case of a "screen" application of the light-emitting device. The cap 30 may further include a layer or plate 33 of a material transparent at the excitation and photoluminescence wavelengths.

In operation, a forward voltage is applied to the light-emitting diodes 40 so that they emit luminous radiation at a so-called excitation wavelength, for example blue light the emission spectrum of which has an intensity peak at approximately 480 nm. The luminous radiation is emitted in the direction of the photoluminescent material 31 through the emitting surface 44.

The photoluminescent material 31 converts at least some of the incident excitation radiation into photoluminescence luminous radiation at a second wavelength termed the photoluminescent wavelength, for example into green light the emission spectrum of which has an intensity peak at 530 nm when the photoluminescent material contains particles of $SrSi_2O_2N_2$:Eu.

The emission spectrum of the light-emitting device therefore corresponds locally to the superposition of at least some of the luminous radiation emitted by the light-emitting diode and not converted by the photoluminescent material and at least some of the luminous radiation converted by the photoluminescent material.

Also, a reverse voltage is applied to the photodiodes 50 so that they detect incident luminous radiation received through the receiving surface 54.

According to the invention, because the photoluminescent material 31 contains photoluminescent particles and covers the emitting surface 44 and the receiving surface 55, some of the excitation luminous radiation is diffused or backscattered in the direction of the receiving surface 54 of the adjacent photodiode 50. Accordingly, because the active zone 53 of the photodiode 50 is made of a material of identical composition to that of the light-emitting diode 40, the photodiode is adapted to detect at least some of the backscattered excitation radiation. The electrical signal from the photodiode resulting from the detection of the incident luminous radiation is then read.

When the photoluminescent particles have an average size less than the excitation wavelength, as is the case of the semiconductor nanocrystals referred to above, the diffusion of the excitation radiation in the direction of the adjacent photodiode is known as Rayleigh diffusion, which is essentially isotropic. If the photoluminescent particles have an average size greater than the excitation wavelength, as is the case of grains of YAG:Eu, for example, the diffusion is known as Mie diffusion. In both types of diffusion, the backscattered component of the luminous radiation is non-zero and can therefore be detected by the adjacent photodiode.

The optoelectronic light-emitting device therefore has the advantage of emitting light with an emission spectrum that notably depends on the properties of the photoluminescent material and the emission spectrum of the light-emitting diodes whilst allowing local detection of some of the light emitted by each of the light-emitting diodes.

This is therefore an optoelectronic light-emitting device with integrated and localized control of the emission from the light-emitting diodes. Detection by the adjacent photodiode is facilitated because the detection active zone has the same optical and electronic properties as the emitting active zone.

There is therefore access to the luminous radiation actually emitted by the light-emitting diodes via the detection effected by the adjacent photodiodes, independently of the conversion of light effected by the photoluminescent particles. This is particularly advantageous when the light-emitting device includes a plurality of photoluminescent blocks adapted to convert the excitation light to different photoluminescent wavelengths, for example if some photoluminescent blocks are adapted to convert to red, others to green, others to yellow, etc. Accordingly, regardless of the wavelength of the photoluminescent radiation from the various blocks, the excitation luminous radiation from the various light-emitting diodes is detected locally by the adjacent photodiodes.

Moreover, the coplanar mesa structure with stepped light-emitting diodes and photodiodes makes it possible to obtain a high density of diodes with lateral dimensions of the light-emitting diodes and the photodiodes that can be of the order of 10 μm to 50 μm. The electrical connection of the diodes is also facilitated at the same time as guaranteeing good electrical insulation between the electrical connection elements.

Finally, the light-emitting device includes light-emitting diodes and photodiodes integrated in a monolithic fashion that can be produced simultaneously by the fabrication process described in detail later.

Figure 1B:
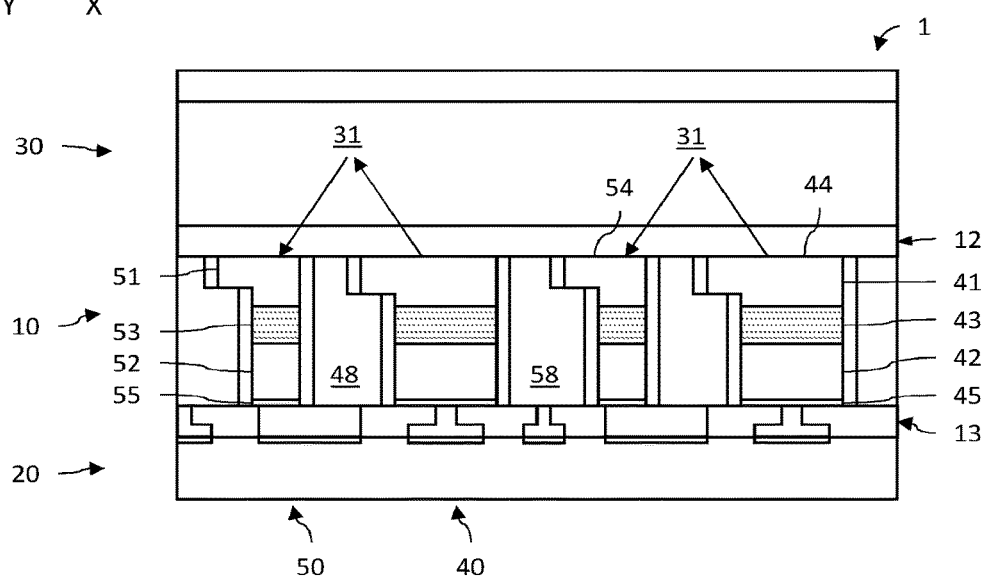

FIG. 1b illustrates another embodiment of the light-emitting device represented in FIG. 1a. It differs therefrom essentially by the photoluminescent material cap 30 and the electrical connection layer 13.

In this example, the optoelectronic chip is similar to that represented in FIG. 1a except that here connection elements 22 provide the electrical connection of the lateral connection element 48 of the light-emitting diode and the conductive portion 55 of the adjacent photodiode to the same conductive portion 22 of the control chip 20. Here the lateral connection element 48 of the light-emitting diode 40 is disposed between the light-emitting diode 40 and the adjacent photodiode 50. The P-doped portion 52 of the photodiode and the N-doped portion 41 of the light-emitting diode are therefore at the same electrical potential.

In a variant in which the lateral connection element of the photodiode is situated between the light-emitting diode and the adjacent photodiode (cf. FIG. 2a), a connection element can provide the electrical connection of the conductive portion of the light-emitting diode and the lateral connection element of the adjacent photodiode to the same conductive portion of the control chip. The P-doped portion of the light-emitting diode and the N-doped portion of the adjacent photodiode are therefore at the same electrical potential.

Also, here the cap 30 includes a layer 31 of a material containing photoluminescent particles identical or similar to that described above. The same material therefore covers a plurality of light-emitting diode/adjacent photodiode pairs.

Figure 2A:
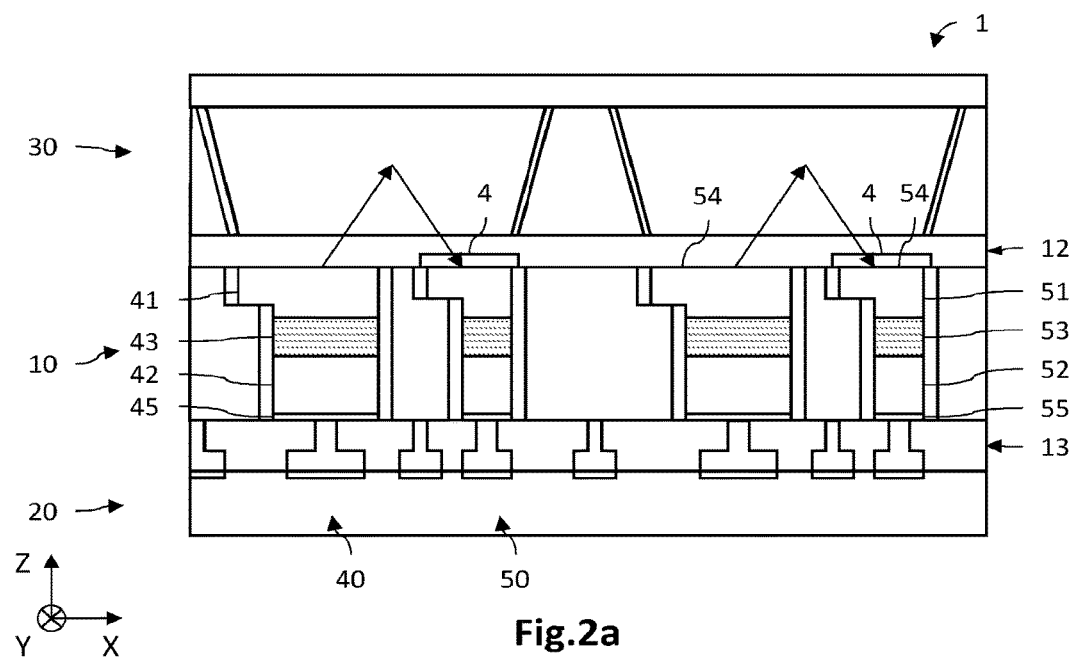
FIG. 2a is a diagrammatic sectional view of an optoelectronic light-emitting device according to another embodiment adapted to detect the photoluminescent radiation and FIG. 2b is a detailed view of the stack of semiconductor portions of the light-emitting diode and the adjacent photodiode of an optoelectronic device of this kind.
Figure 2B:
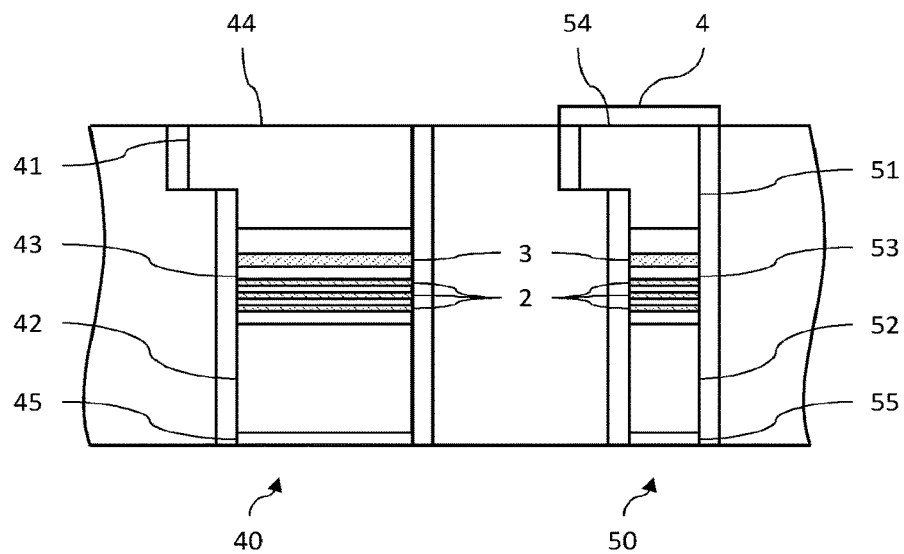

FIGS. 2a and 2b illustrate another embodiment of the optoelectronic light-emitting device that differs from that illustrated in Figure is essentially in that the optoelectronic device is adapted to emit excitation radiation via light-emitting diodes and to detect at least some of the photoluminescence radiation by means of the adjacent photodiodes.

In this example, the photoluminescent material cap 30 and the control chip 20 are identical or similar to those described with reference to FIG. 1a. The light-emitting diodes 40 and the photodiodes 50 have a coplanar mesa structure identical to that described with reference to FIG. 1a.

The active zone 53 of the photodiodes is adapted to detect the photoluminescence luminous radiation received through the receiving surface 54. To this end, as FIG. 2b illustrates in detail, the active zone 53 includes at least one quantum well 3 based on a semiconductor material having a forbidden band energy lower than that of the doped portions 51, 52 and making it possible to detect the received photoluminescence radiation. Because the photoluminescence wavelength is greater than the excitation wavelength, the quantum well 3 has a forbidden band energy lower than that of the quantum wells 2 adapted to detect the excitation radiation. For example, the quantum well 3 may be made of InGaN with 23% indium to detect green photoluminescence radiation at approximately 530 nm. Alternatively, the quantum well 3 may be made of InGaN with 30% indium to detect red photoluminescence radiation at approximately 600 nm.

Because the detection active zone 53 and the emission active zone 43 have the same material composition, the quantum well 3 for detecting photoluminescence is also present in the active zone 43 of the adjacent light-emitting diode. So as not to modify the emission properties of the light-emitting diodes, the quantum well 3 is preferably situated between the quantum wells 2 and the N-doped portion 41. In fact, the mobility of holes being lower than that of electrons, the emission of the luminous radiation occurs essentially in the quantum wells 2 situated in the vicinity of the P-doped portion 42. The emission spectrum of the light-emitting diodes is therefore not modified by the presence of photoluminescence detection quantum wells in the emitting active zones.

In the active zone 53 of the adjacent photodiode, the quantum well 3 is able to detect the photoluminescence radiation as well as the excitation radiation. To detect only the photoluminescence radiation, it is advantageous to provide an optical filter 4 between the receiving surface 54 of the photodiodes and the photoluminescent material 31 so as to transmit the photoluminescence luminous radiation and to block the transmission of the excitation luminous radiation. In the manner known in itself, the optical filter may be formed of a multilayer stack of dielectric materials such as SiN and SiO2, for example.

The light-emitting device therefore has the advantages referred to above at the same time as being able to detect photoluminescence light converted by the photoluminescent material as close as possible to the light-emitting diode, because emission by photoluminescence is substantially isotropic. In situations where the cap includes photoluminescent blocks adapted to emit at different wavelengths, the various photodiodes therefore make it possible to detect the intensity of the various components of the overall emission spectrum of the optoelectronic device itself. By slaving the control signal of the various light-emitting diodes to the detection signal from the photodiodes it is possible to modify the overall emission spectrum of the optoelectronic device. Moreover, when the cap includes a photoluminescent material that covers the light-emitting diodes and the photodiodes with no discontinuity, the light-emitting device makes it possible to detect the photoluminescent spatial response of the material and therefore to establish the spatial distribution or map of photoluminescence of the material.

Moreover, to optimize the luminous emission yield of the light-emitting diodes, a film of a reflecting material (not shown) coats the face of the insulative portions of the light-emitting diodes opposite the face in contact with the semiconductor portions. The film can be made of aluminium, silver or any other material the reflectance of which at the excitation wavelength is greater than or equal to 80%, preferably greater than or equal to 90%, even 95%.

Moreover, so as to limit the transmission of the excitation radiation as far as the active zone of the photodiode, notably if the incident excitation radiation has an angle of incidence relative to the optical filter reflected in a drop in the rejection rate of the excitation radiation by the filter, a film of an absorbent material (not shown) coats the face of the insulative portions of the photodiodes opposite the face in contact with the semiconductor portions. The film may be made of gold or any other material the absorbency of which at the excitation wavelength is greater than or equal to 80%, preferably greater than or equal to 90%, even 95%.

An example of a method of producing a light-emitting device according to another embodiment is described next with reference to FIGS. 3a to 3h. This example is similar to that described in patent application FR1456085 filed 27 Jun. 2014 the text of which is considered as forming an integral part of the present description.

Figure 3A:
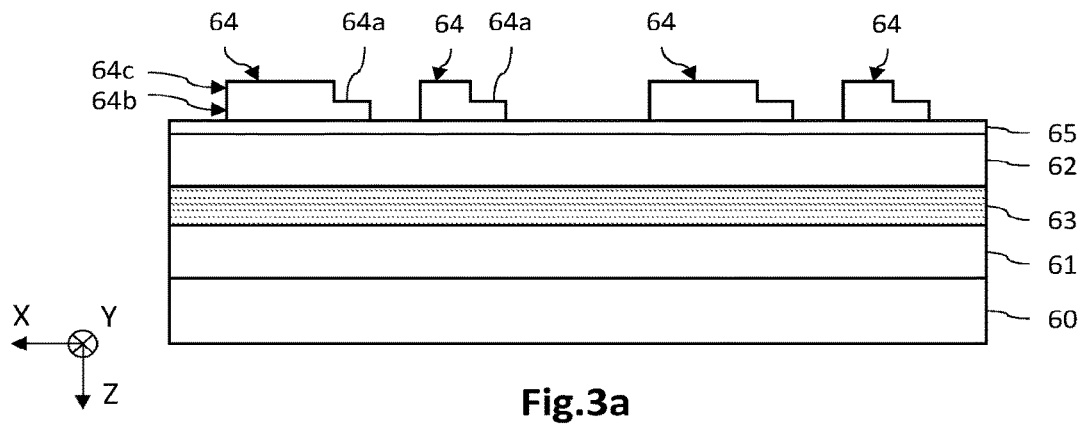
FIGS. 3a to 3h illustrate the steps of a method of manufacturing an optoelectronic device according to another embodiment.

Referring to FIG. 3a, there is formed on a growth substrate 60 a stack formed of an N-doped semiconductor layer 61, an active layer 63 including quantum wells including at least one so-called emissive quantum well and at least one so-called detection quantum well described with reference to FIG. 2a interleaved between barrier layers, and a P-doped semiconductor layer 62. The free surface of the P-doped layer is then coated with an electrically conductive layer 65, for example a layer of aluminium or silver. These stacked layers are intended to form the P-doped portions 42, 52, the N-doped portions 41, 51 and the active zones 43, 53 of the light-emitting diodes and the photodiodes, together with the conductive portions 45, 55. Note that the N-doped layer 61 may include a strongly doped part N+ covering the substrate covered with a part having a lower doping level. The two parts of the N-doped layer may be made from the same material or two different materials. Also, the growth substrate may be made from an insulative material, for example sapphire, or a semiconductive material, for example silicon, or based on a III-V or II-VI material.

Hard mask structured pads 64 are then deposited. Pads with large lateral dimensions are intended to form the light-emitting diodes while pads with smaller lateral dimensions are intended to form the photodiodes. The pads 64 have a structure forming a step 64a at the level of a lateral flank. Accordingly, each pad 64 includes a first part 64b forming a base that rests on the conductive layer 65 and the lateral dimensions of which subsequently define those of the second part 41b, 51b of the N-doped portions 41, 51 of the diodes. It includes a second part 64c that extends from the first part 64b and the lateral dimensions of which subsequently define those of the first part 41a, 51a of the N-doped portions, the active zone 43, 53 and the P-doped portion 42, 52 of the diodes. The thicknesses of the two parts of the hard masks are chosen as a function of the speed of etching the various materials of the stack of layers.

Figure 3B:
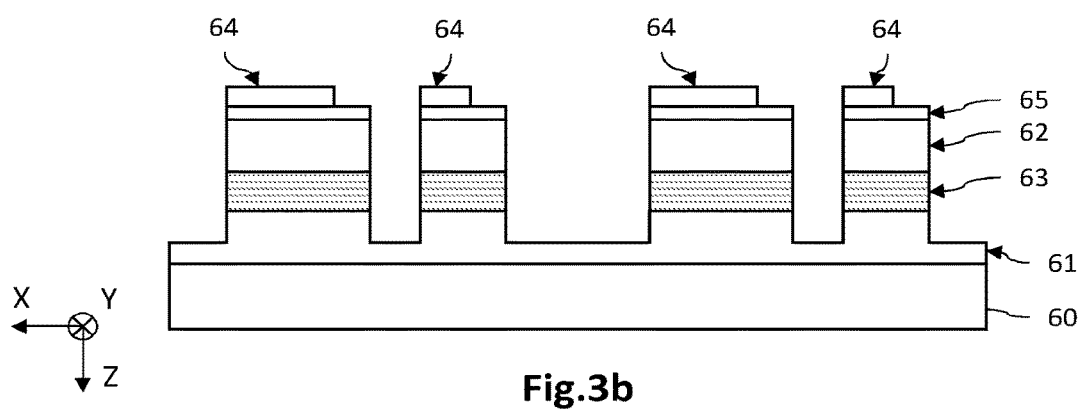

Referring to FIG. 3b, the stack comprising the conductive layer 65, the P-doped layer 62, the active layer 63 and part of the N-doped layer 61 is etched from the exposed surface of the stack between the hard mask pads 64. The part 64a forming a step of the hard mask pads is also etched during this step. The etching process is dry etching, such as reactive ion etching or plasma etching.

Figure 3C:
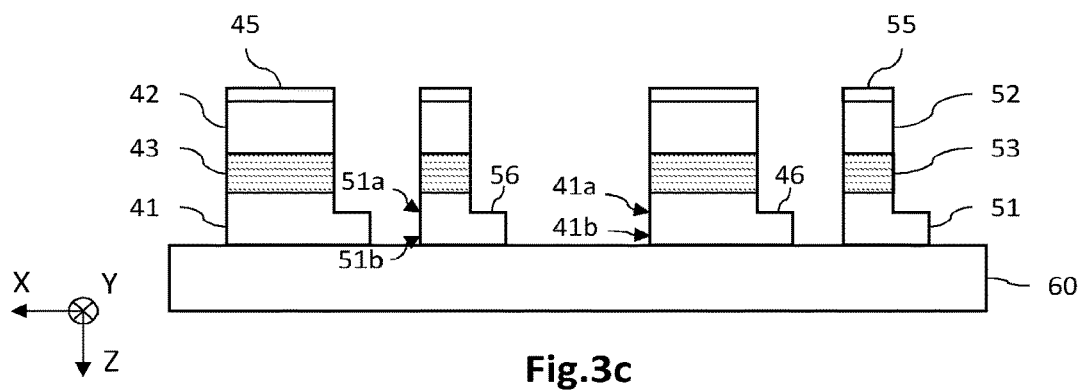

Referring to FIG. 3c, etching continues from the exposed surface of the stack not covered by the hard mask pads 64. In this way there is obtained a plurality of coplanar mesa structures each formed of a stack comprising a conductive portion 45, 55, a P-doped portion 42, 52, an active zone 43, 53 and an N-doped portion 41, 51 featuring a step 46, 56 between a first part 41a, 51a in contact with the active zone and a second part 41b, 51b covering the substrate 60. The first part 41a, 51a of the N-doped portion has lateral dimensions in the plane (X,Y) less than those of the second part 41b, 51b so as to form a stepped surface 46, 56. The mesa structures intended to form light-emitting diodes preferably have lateral dimensions greater than those of the adjacent mesa structures intended to form photodiodes. The conductive portions have an exposed surface, i.e. a surface free of any hard mask residues.

Figure 3D:
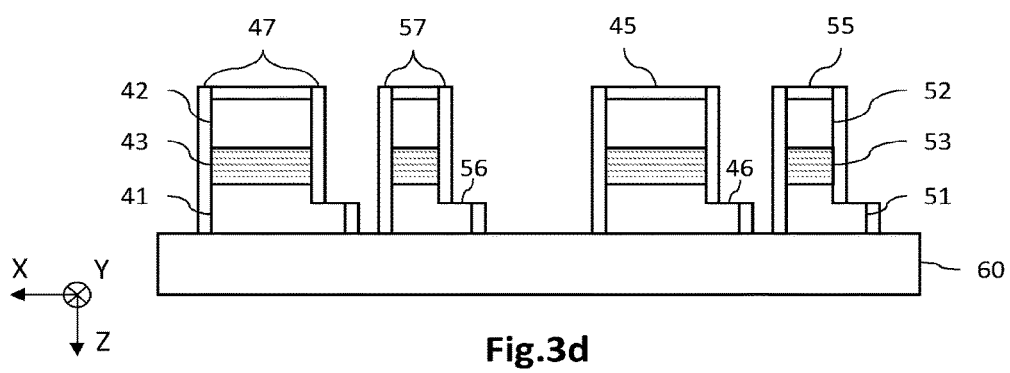

Referring to FIG. 3d, there are produced the insulative portions 47, 57 disposed in the gaps between the mesa structures and covering the lateral flanks thereof with the exception of the stepped surfaces 46, 56. The insulative portions can be produced by deposition conforming to a layer of dielectric material, for example SiN, between 3 nm and 100 nm inclusive thick, covering the mesa structures and the exposed surface of the substrate with no discontinuity. Only the portions situated on the lateral flanks of the mesa structures are retained afterwards, by dry etching portions of the dielectric layer situated between the mesa structures, on the stepped surfaces and on the face of the conductive portions.

A film of a material that is reflective at the excitation wavelength, for example aluminium or silver, may optionally be produced by standard steps of lithography, etching and deposition of cathode sputtering or chemical deposition type in the vapour phase to cover the exposed surface of the insulative portions that cover the lateral flanks of the mesa structures intended to form the light-emitting diodes. By way of illustration, the thickness of the film may be less than or equal to 50 nm in the case of aluminium or less than or equal to 75 nm in the case of silver. A film may equally be produced from a material absorbent at the excitation wavelength, for example gold, covering the exposed surface of the insulative portions that cover the lateral flanks of the mesa structures intended to form photodiodes. For example, the thickness of the film may be greater than or equal to 100 nm in the case of gold. Dry etching is optionally carried out to expose again the surface of the conductive portions and so that the insulative portions electrically insulate the conductive portions of the reflective or absorbent films. If the reflective and absorbent films are electrically conductive, they can cover the corresponding stepped surfaces.

Figure 3E:
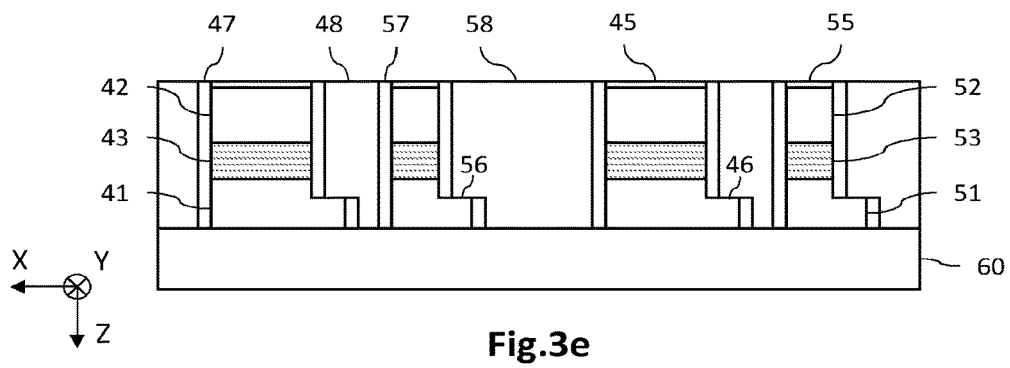

Referring to FIG. 3e, the lateral connection elements 48, 58 are produced by filling the gaps between the mesa structures. To this end there is carried out full-wafer deposition of an electrically conductive material followed by mechanical-chemical planarization and/or etching, for example RIE, to eliminate the deposited conductive material covering the mesa structures and thus to free the upper face of the conductive portions 45, 55 and that of the insulative portions 47, 57. The upper face obtained is then substantially plane.

Figure 3F:
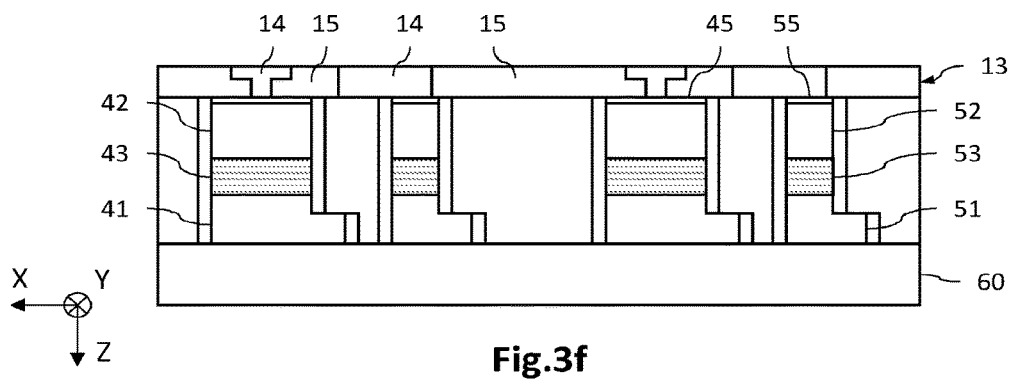

Referring to FIG. 3f, an electrical connection layer 13 covering the upper face of the structure obtained following the previous step is produced; the connecting layer is formed of a dielectric material 15 surrounding connection elements 14 that extend between the two opposite faces of the layer 13 and come into contact with the conductive portions 45, 55 and lateral connection elements 48, 58. To this end, a dielectric layer is deposited on the structure obtained, after which cavities intended to receive the connection elements are defined by lithography and etching. These cavities are then filled with a full-wafer deposit of an electrically conductive material, for example aluminium, followed by mechanical-chemical planarization. The connecting layer has a substantially plane free face suitable for adhesive bonding, for example direct adhesive bonding, to a control chip.

Figure 3G:
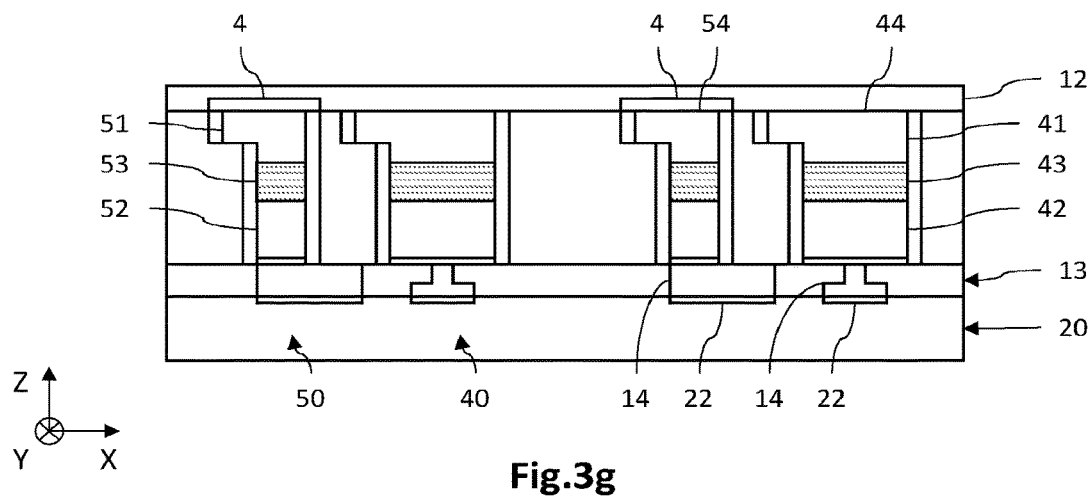

Referring to FIG. 3g, the structure formed on a control chip 20 is fixed at the level of the free surface of the connection layer 13. The control chip includes electrically conductive polarization portions 22 coming into contact with connection elements 14 of the connection layer 13. Attachment may notably be by way of direct adhesive bonding or adhesive bonding by molecular adhesion between the respective metal surfaces of the optoelectronic chip and the control chip as well as between the respective dielectric surfaces of the two chips. Alternatively, fastening by electrical connection microbumps and/or by thermocompression may also be effected.

In this example, the growth substrate 60 is removed, for example by mechanical-chemical planarization and/or dry etching, so as to expose the upper face of the optoelectronic chip including the emitting surface 44 and the receiving surface 54 of the diodes 40, 50.

Conventional lithography, etching and deposition steps then produce optical filters 4 covering the receiving surface 54 of the photodiodes, for example with alternating dielectric material layer portions. The upper face of the optoelectronic chip and the optical filters 4 are then covered with a layer 12 of a dielectric material that is planarized afterwards, for example by mechanical-chemical means. The free face of the layer may be locally structured to form raised patterns 5 facing the emitting surfaces and possibly the receiving surfaces.

Figure 3H:
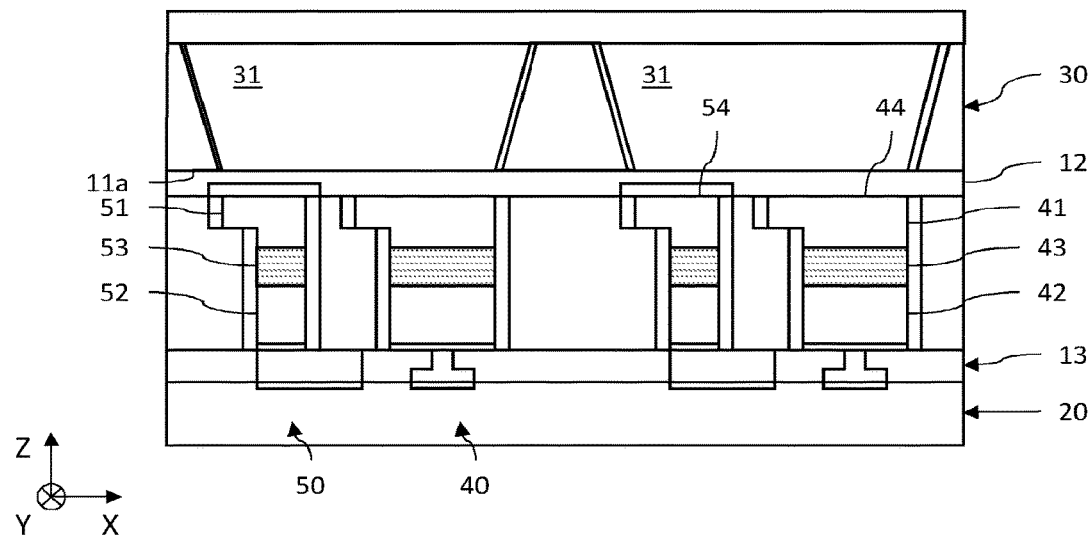

Referring to FIG. 3h, a cap 30 including blocks 31 of material containing photoluminescent particles is attached to the front face 11a of the optoelectronic chip so that the photoluminescent material covers the emitting surface 44 of the light-emitting diodes and the receiving surface 54 of the adjacent photodiodes. Here each photoluminescent block 31 faces a pixel including a light-emitting diode and an adjacent photodiode. The photoluminescent blocks may have different luminescence wavelengths to one another.

A frame can therefore be fixed to the optoelectronic chip, by thermocompression or direct adhesive bonding, including an array of through-openings intended to receive the photoluminescent blocks, the openings then being filled by a so-called additive method of depositing the photoluminescent material. The process may be inkjet printing, heliography, silkscreen printing, flexography, spray coating or deposition of droplets, or any other suitable process. The binder matrix can then be polymerized, for example by ultraviolet radiation.

Particular embodiments have just been described. Various modifications and variants will be apparent to the person skilled in the art.

Thus the embodiments described above refer to an N-doped portion having a stepped surface and a P-doped portion facing the control chip. The conductivity types of the doped portions can of course be reversed.

Moreover, some blocks need not include photoluminescent material but rather an optically inert material, i.e. one not emitting light in response to possible absorption of the excitation radiation, and containing diffusing particles dispersed in a binder matrix. The diffusing particles can have a nanometric mean size, for example between 0.2 nm and 1000 nm inclusive, possibly of the order of 5 nm to 10 nm, or a micrometric average size, for example between 1 μm and 50 μm inclusive, possibly of the order of 10 μm.

The invention claimed is:

1. Optoelectronic light-emitting device, including:
   at least one light-emitting diode having an emitting surface adapted to emit excitation radiation; and
   a photoluminescent material that coats the emitting surface, the photoluminescent material containing photoluminescent particles adapted to convert said excitation radiation through the emitting surface at least in part into photoluminescence radiation; wherein
   at least one photodiode includes a photodiode included adjacent to the at least one light-emitting diode, having a receiving surface coated by the photoluminescent material, and adapted to detect at least part of the excitation radiation or the photoluminescence radiation coming from the photoluminescent material through the receiving surface,
   each of the at least one light-emitting diode and the photodiode has a mesa structure, the emitting surface and the receiving surface being substantially coplanar,
   each of the at least one light-emitting diode and the photodiode includes a first semiconductor portion doped with a first conductivity type and a second semiconductor portion doped with a second conductivity type opposite the first conductivity type, the first and second semiconductor portions being respectively substantially coplanar and made from a same material,
   each of the first doped semiconductor portion of the at least one light-emitting diode and the first doped semiconductor portion of the photodiode has a lateral flank including a stepped surface formed by a second part of the first doped semiconductor portion facing a first part of the first doped semiconductor portion,
   a lateral electrical connection element fills a gap formed by lateral flanks of the mesa structures of the at least one light-emitting diode and the adjacent photodiode so as to be in electrical contact with the stepped surface of the first doped semiconductor portion of the at least one light-emitting diode, the lateral connection element being further electrically insulated from the second doped semiconductor portion and active zone of the at least one light-emitting diode by dielectric portions covering the lateral flanks of the second doped semiconductor portion and active zone of the at least one light-emitting diode and electrically insulated from the adjacent photodiode by a dielectric portion covering the lateral flank of the adjacent photodiode facing the at least one light-emitting diode, and
   a control chip disposed at a side of the at least one light-emitting diode and of the photodiode opposite the emitting surface and the receiving surface, the control chip being connected to the lateral electrical connection element and including separate elements connected to the at least one light-emitting diode and to the adjacent photodiode.

2. The optoelectronic device according to claim 1, in which each of the at least one light-emitting diode and the photodiode includes an active zone situated between the first and second doped semiconductor portions, the active zone of each of the at least one light-emitting diode and the photodiode being substantially coplanar and made from a same material.

3. The optoelectronic device according to claim 2, in which the active zone of each of the at least one light-emitting diode and the photodiode includes at least one first quantum well, said first quantum well of the active zone of the at least one light-emitting diode being adapted to emit the excitation radiation at an excitation wavelength.

4. The optoelectronic device according to claim 3, in which the active zone of each of the at least one light-emitting diode and the photodiode includes at least one second quantum well, said second quantum well of the active zone of the photodiode being adapted to detect the photoluminescence radiation.

5. The optoelectronic device according to claim 4, in which the second quantum well is situated between an N-type first doped semiconductor portion and the first quantum well.

6. The optoelectronic device according to claim 1, including an optical filter disposed between the photoluminescent material and the receiving surface of the photodiode, the optical filter being adapted to transmit the photoluminescence radiation and to block transmission of the excitation radiation.

7. The optoelectronic device according to claim 1, wherein the control chip is adapted to modify the excitation radiation emitted by the at least one light-emitting diode based on a signal resulting from detection of the excitation radiation or the photoluminescence radiation by the photodiode.

8. The optoelectronic device according to claim 1, including electrical contacts adapted to bias the at least one light-emitting diode and the photodiode, the electrical contacts being situated at a face of the at least one light-emitting diode and of the photodiode opposite the emitting surface and the receiving surface.

9. The optoelectronic device according to claim 8, wherein the face of the at least one light-emitting diode and of the photodiode at which the electrical contacts are situated is planar.

10. The optoelectronic device according to claim 7, including an electrical contact directly connecting the lateral electrical connection element to the control chip.

* * * * *